(12) United States Patent
Matsumoto et al.

(10) Patent No.: US 6,194,888 B1
(45) Date of Patent: Feb. 27, 2001

(54) IMPEDANCE-TO-VOLTAGE CONVERTER AND CONVERTING METHOD

(75) Inventors: Toshiyuki Matsumoto, Hyogo-ken; Yoshihiro Hirota, Kyoto; Muneo Harada, Hyogo-ken, all of (JP)

(73) Assignee: Sumitomo Metal Industries Limited, Osaka (JP)

( * ) Notice: Subject to any disclaimer, the term of this patent is extended or adjusted under 35 U.S.C. 154(b) by 0 days.

(21) Appl. No.: 09/402,385

(22) PCT Filed: Jan. 22, 1999

(86) PCT No.: PCT/JP99/00230

§ 371 Date: Oct. 4, 1999

§ 102(e) Date: Oct. 4, 1999

(87) PCT Pub. No.: WO99/40447

PCT Pub. Date: Aug. 12, 1999

(30) Foreign Application Priority Data

Feb. 5, 1998 (JP) .................................................. 10-024384

(51) Int. Cl.[7] .................................................... H03H 1/00
(52) U.S. Cl. ......................................... 323/364; 323/369
(58) Field of Search .................................... 323/266, 273, 323/293, 295, 352, 353, 364, 369

(56) References Cited

U.S. PATENT DOCUMENTS

| 4,473,796 | 9/1984 | Nankivil . | |
|---|---|---|---|
| 4,498,044 | 2/1985 | Horn . | |
| 4,918,376 | 4/1990 | Poduje et al. . | |
| 5,416,470 | 5/1995 | Tanaka et al. . | |
| 5,515,723 | 5/1996 | Tsuchida et al. . | |
| 5,701,101 | * 12/1997 | Weinhardt et al. | 327/561 |
| 5,808,516 | * 9/1998 | Barber | 330/282 |
| 5,886,529 | 3/1999 | Wakamatsu . | |
| 6,054,867 | 4/2000 | Wakamatsu . | |

FOREIGN PATENT DOCUMENTS

| 3413849 A1 | 8/1985 | (DE) . |
|---|---|---|
| 4135991 C1 | 12/1992 | (DE) . |
| 1580335 | 12/1980 | (EP) . |
| 0193421 A1 | 9/1986 | (EP) . |
| 2002143 | 2/1979 | (GB) . |
| 2020816 | 11/1979 | (GB) . |
| 06180336 | 6/1994 | (JP) . |
| 09 280 806 | * 10/1997 | (JP) . |

OTHER PUBLICATIONS

"OP–AM Circuit Measures Diode–Junction Capacitance Electronics", Monticell et al., Electronic Week, Jul. 1975.*

Monticelli et al. "Op–amp circuit measures diode–junction capacitance" Electronics Week, vol. 48, No. 14, Jul. 10, 1975, pp. 112–113.

Dai Ming Yuan, Wien–Robinson–Oszillator zur Messung kleiner Kapazitätsänderungen, Elektronik, vol. 37, No. 9, Apr. 29, 1988, pp. 86–89.

* cited by examiner

*Primary Examiner*—Matthew Nguyen
(74) *Attorney, Agent, or Firm*—Barnes & Thornburg

(57) ABSTRACT

An impedance-to-voltage converter utilizes an operational amplifier to convert an impedance into a voltage without suffering from the influence of stray capacitances. The impedance-to-voltage converter is formed of an operational amplifier which has an imaginary short-circuit state between an inverting input and a non-inverting input thereof when an impedance element is connected between an output and the inverting input, a shielding line for shielding a line for connecting the impedance element to the inverting input, an AC signal generator connected to the non-inverting input, and a shielding line for shielding the signal line. The shielding lines are connected to the non-inverting input.

10 Claims, 4 Drawing Sheets

IMPEDANCE-TO-VOLTAGE CONVERTER AND CONVERTING METHOD

RELATED APPLICATION

The present application is 371 of International application Ser. No. PCT/JP99/00230, filed Jan. 22, 1999.

TECHNICAL FIELD

The present invention relates to an impedance-to-voltage converter and an associated converting method which are capable of highly accurate conversion of an impedance into a voltage utilizing an operational amplifier in an imaginary short-circuit state.

BACKGROUND ART

FIG. 1 generally illustrates the configuration of a static capacitance-to-voltage converter described in Laid-open Japanese Patent Application No. 61-14578. This static capacitance-to-voltage converter has been proposed to solve a problem of the prior art which suffers from the inability of accurate voltage conversion due to the fact that a stray capacitance of a cable used to connect with an unknown static capacitance is superimposed on the unknown static capacitance, and that these static capacitances may vary due to movements and bending of the cable or the like. As illustrated in FIG. 1, an alternate current (AC) signal generator OS and an operational amplifier OP are connected with an unknown capacitance Cx whose cables are covered with shielding lines s to reduce the influence of stray capacitances Csl, Cs2, Cs3. Specifically, an output and an inverting input of the operational amplifier OP are connected through a feedback circuit formed of a parallel circuit including a resistor Rf and and a capacitor Cf. The unknown capacitance Cx has one end connected to the inverting input of the operational amplifier OP through a shielding line s, and the other end connected to the AC signal generator OS through another shielding line s. Both of the shielding lines s and a non-inverting input of the operational amplifier OP are grounded.

With the configuration described above, since substantially no potential difference exists between the two inputs of the operational amplifier OP, the stray capacitance Cs2 is not charged. Also, since the stray capacitance Cs3 is regarded as a coupling capacitance of both the shielding lines s, the stray capacitance Cs3 can be eliminated by grounding the shielding lines s. In this way, the influence exerted by the stray capacitances of the cables for connecting the unknown capacitance Cx is reduced by using the shielding lines s, so that a charge equal to that induced on the unknown static capacitance Cx is induced on the capacitor Cf of the feedback circuit, resulting in an output proportional to the unknown static capacitance Cx produced from the operational amplifier OP. Stated another way, assuming that an output voltage of the AC signal generator OS is Vi, an output voltage Vo of the operational amplifier OP is expressed by $-(Cx/Cf)Vi$, so that the converter of FIG. 1 may be used to convert the unknown static capacitance Cx into the voltage Vo from which the unknown static capacitance Cx can be derived together with the known values Cf and Vi.

SUMMARY OF THE INVENTION

The known static capacitance-to-voltage converter described above, however, implies a problem that as an unknown static capacitance Cx is smaller, the influence of stray capacitances becomes prominent, so that the static capacitance Cx cannot be accurately converted into a voltage. In addition, since the feedback circuit of the operational amplifier OP is formed of a parallel circuit including the resistor Rf and the capacitor Cf, separate steps are required to form a resistor and a capacitor for actually integrating necessary components into a converter in a one-chip form, causing disadvantages of a complicated manufacturing process and an increased chip size. Furthermore, since the capacitor cannot be applied with an AC signal when one electrode of the static capacitance Cx is being biased at a certain potential, a conversion of the static capacitance Cx into a voltage cannot be performed.

The present invention has been proposed to solve the problems mentioned above, and it is therefore an object of the present invention to provide an impedance-to-voltage converter and an associated converting method which are capable of highly accurate conversion of an impedance into a voltage utilizing an operational amplifier in an imaginary short-circuit state to eliminate the influence of stray capacitances between a line connected to a non-inverting input of the operational amplifier and a shielding line surrounding the line.

To achieve the above object, the present invention provides an impedance-to-voltage converter which comprises:

an operational amplifier having an inverting input, a non-inverting input and an output, said operational amplifier placed in an imaginary short-circuit state between said inverting input and said non-inverting input;

an impedance element connected between said output and said inverting input containing a connection line having one end connected to said impedance element, and the other connected to said inverting input;

a circuit element having a known impedance;

a signal line having one end connected to said inverting input, and the other connected to said circuit element;

a shield surrounding at least a portion of said signal line and/or said connection line;

an alternate current voltage generator connected to said non-inverting input.

Also, to achieve the above object, the present invention provides a method of converting an impedance into a voltage to gain alternate current voltage corresponding to the change of the impedance of impedance element, comprising the step of:

providing an operational amplifier having an inverting input, a non-inverting input and an output;

connecting an impedance element between said inverting input and said output;

connecting a circuit element having a known impedance to said inverting input;

providing shield for surrounding at least a portion of a connection line connected between said impedance element and said inverting input, and/or a signal line connected between said circuit element and said inverting input;

connecting said shield and said non-inventing input;

applying said non-inverting input with an alternate current voltage.

The impedance element may be any of a variety of sensors including a strain sensor, a geomagnetic sensor, a capacitive sensor and so on, and the impedance of such an impedance element may be at least one of resistance, inductance, capacitance, and conductance of a transistor.

The shield preferably surrounds whole of said signal line and said connection line.

In the present invention, the alternate current voltage output from the operational amiplifier may be integrated to output a direct current voltage representative of the impedance of the impedance element.

Since the operational amplifier is in an imaginary short-circuit state between the inverting input and the non-inverting input, it is possible to eliminate a stray capacitance between the connection line for connecting an impedance element to the inverting input and the shield surrounding the connection line, and a stray capacitance formed between the signal line and the shield surrounding the signal line. Therefore, an alternate current voltage corresponding to the impedance of the impedance element is output from the operational amplifier without suffering from such stray capacitances between the connection line, the signal line and the shield, however long they are.

BEST MODE FOR CARRYING OUT THE INVENTION

The present invention will hereinafter be described in detail in connection with an embodiment thereof with reference to the accompanying drawings.

Figure 1:
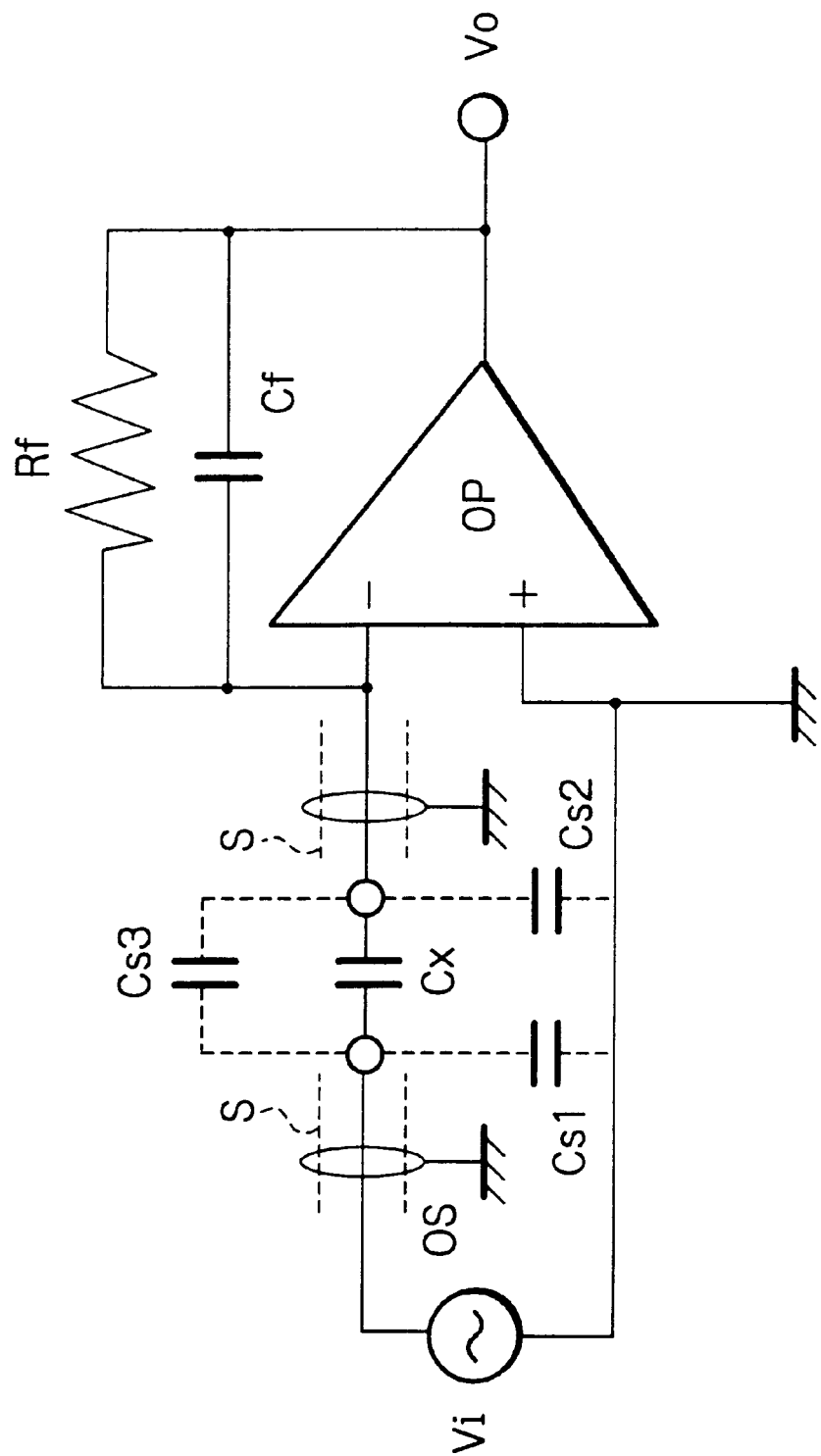
FIG. 1 is a schematic circuit diagram illustrating an example of a prior art static capacitance-to-voltage converter.
Figure 2:
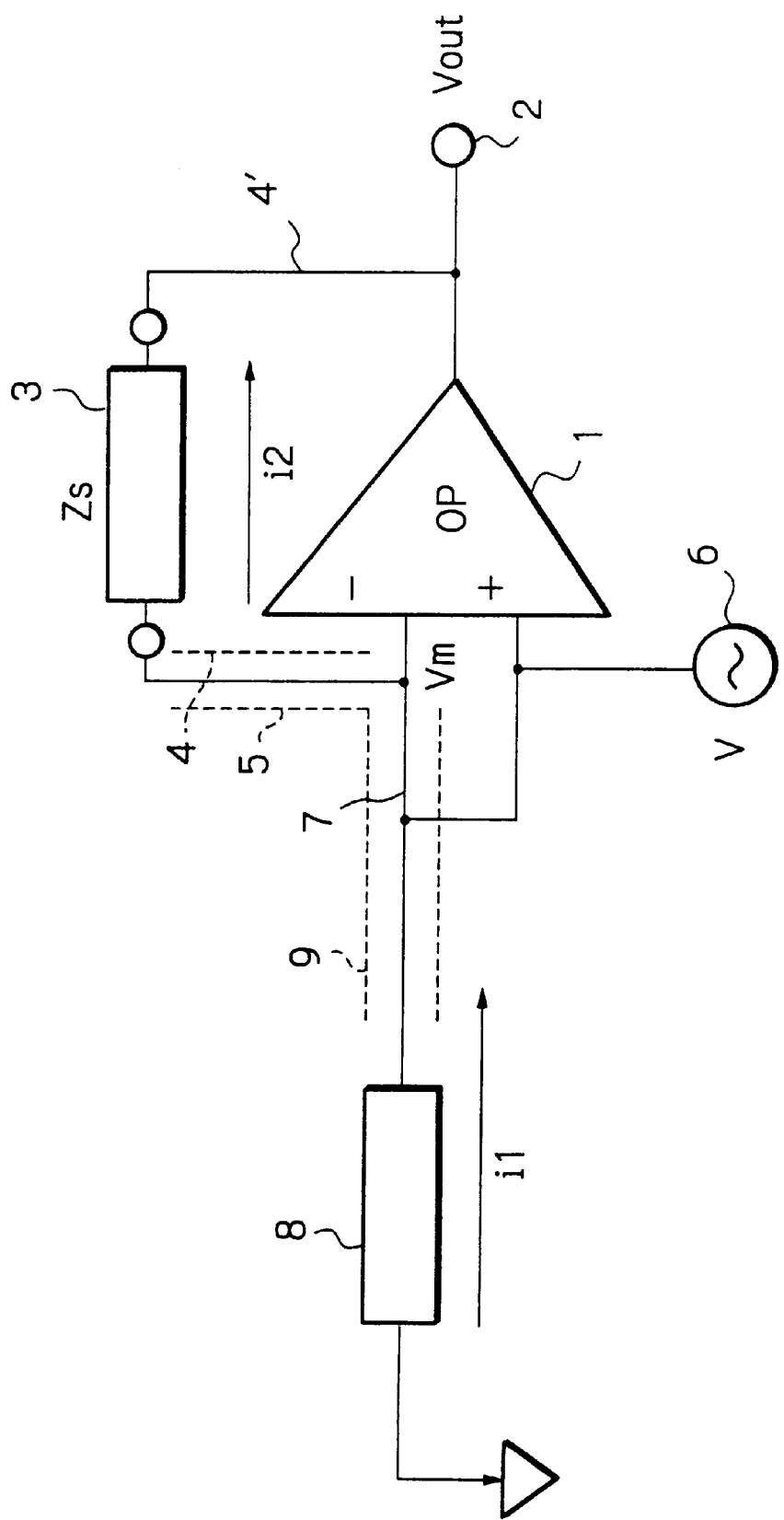
FIG. 2 is a circuit diagram generally illustrating an embodiment of an impedance-to-voltage converter according to the present invention.

FIG. 2 is a circuit diagram generally illustrating an embodiment of an impedance-to-voltage converter according to the present invention. Referring specifically to FIG. 2, the impedance-to-voltage converter comprises an operational amplifier 1. The operational amplifier 1 has a voltage gain extremely larger than a closed loop gain. An impedance element 3 is connected between an output 2 and an inverting input (−) of the operational amplifier 1 to form a negative feedback for the operational amplifier 1. A connection line 4 for connecting between one end of the impedance element 3 and the inverting input (−) of the operational amplifier 1 is surrounded by a shielding line 5 for preventing unwanted signals such as noise from being induced from the outside. The shielding line 5 is not grounded but instead connected to a non-inverting input (+) of the operational amplifier 1.

It should be noted that a connection line 4' for connecting between the other end of the impedance element 3 and the output 2 of the operational amplifier 1 may not be necessarily shielded but may be a naked line. However, if the impedance element 3 is positioned a certain distance or more away from the operational amplifier 1, the connection line 4' is preferably shielded with a grounded shielding line.

The operational amplifier 1 is supplied with an AC signal from an AC signal generator 6 at the non-inverting input (+), and has the inverting input (−) connected to one end of a signal line 7. The other end of the signal line 7 is connected to one end of a resistor 8 that has a known resistance value. The other end of the resistor 8 is biased with a known direct current (DC) voltage.

The signal line 5 is surrounded by a shielding line 9 for preventing unwanted signals such as noise or the like from being induced into the signal line 7 from the outside. The shielding line 9 is not grounded but instead is connected to the non-inverting input (+) of the operational amplifier 1.

As is understood from the foregoing, the shielding line 5 and the shielding line 9 are at the same potential as the non-inverting input (+) of the operational amplifier 1. Actually, as illustrated in FIG. 2, the shielding line 5 and the shielding line 9 may be electrically connected to each other, with any portion thereof being connected to the non-inverting input (+).

The operational amplifier 1 is formed with a negative feedback through the impedance element 3, and the operational amplifier 1 has a voltage gain extremely larger than a closed loop gain, so that the operational amplifier 1 is placed in an imaginary short-circuit state. In other words, a difference in voltage between the inverting input (−) and the non-inverting input (+) of the operational amplifier 1 is substantially zero. Thus, the connection line 4, shielding line 5, signal line 7 and shielding line 9 are all at the same potential, thereby making it possible to eliminate the influence of stray capacitances which would otherwise occur between the connection line 4 and the shielding line 5 and between the signal line 7 and the shielding line 9. This holds true irrespective of the lengths of the connection line 4 and the signal line 7, and also holds true irrespective of movements, bending, folding and so on of the connection line 4 and the signal line 7.

The impedance element 3 in FIG. 2 may be any element such as resistance, inductance, capacitance, conductance of a transistor, and so on, as long as it has an arbitrary impedance, and may be, for example, a resistive sensor such as a strain sensor, a magnetic sensor such as a geomagnetic sensor, and any arbitrary capacitive sensor. Specifically, contemplated capacitive sensors may include all devices for detecting a static capacitance as well as any known capacitive sensor such as an acceleration sensor, seismometer, pressure sensor, displacement sensor, displacement meter, proximity sensor, touch sensor, ion sensor, humidity sensor, rain drop sensor, snow sensor, lightening sensor, alignment sensor, touch failure sensor, shape sensor, end point detecting sensor, vibration sensor, ultrasonic sensor, angular velocity sensor, liquid amount sensor, gas sensor, infrared sensor, radiation sensor, level meter, freezing sensor, moisture meter, vibration meter, charge sensor and printed board tester.

Assume now that a signal voltage output from the AC signal generator 6 is V; an angular frequency of the signal voltage V is ω; the resistance of the resistor 8 is Ro, a current flowing through the resistor 8 is $i_1$; the impedance of the impedance element 3 is Zs; a current flowing through the impedance element 3 is $i_2$; a voltage at the inverting input (−) of the operational amplifier 1 is Vm; and an output voltage of the operational amplifier 1 is Vout, the voltage Vm is at the same potential as the signal voltage V output from the AC signal generator 6 at the inverting input (−) since the operational amplifier 1 is in an imaginary short-circuit state, as mentioned above. That is, the following equation is satisfied:

$$V = Vm$$

In addition, the following equations are also satisfied:

$$i_1 = -Vm/Ro \qquad (1)$$

$$i_2 = (V_m - V_{out})/Z_s \tag{2}$$

Since $i_1 = i_2$, the following equation is satisfied when the output voltage Vout of the operational amplifier 1 is solved using the equations (1) and (2):

$$V_{out} = V(1 + Z_s/R_o) \tag{3}$$

The equation (3) means that a voltage corresponding to the impedance Zs of the impedance element 3 is generated at the output 2 of the operational amplifier 1.

As described above, the impedance-to-voltage converter illustrated in FIG. 2 outputs a voltage corresponding to an impedance of an impedance element connected between the output and the inverting input of the operational amplifier, so that it can be used as an impedance detector. Additionally, in the impedance-to-voltage converter of FIG. 2, since the output voltage Vout of the operational amplifier 1 varies in correspondence to a varying impedance of the impedance element 3, it can be seen that the impedance-to-voltage converter of FIG. 2 can also be used as an apparatus for detecting a change in impedance of an impedance element.

Furthermore, since the signal voltage V and the resistance Ro are known in the equation (3), the impedance Zs of the impedance element 3 can be derived from the equation (3) by measuring an output voltage of the operational amplifier 1 when a DC voltage is applied to the non-inverting input (+) of the operational amplifier 1 and an output voltage Vout of the operational amplifier 1 when the signal voltage V from the AC signal generator 6 is applied to the non-inverting input (+), and calculating the difference between these output voltages.

Since a direct current in proportion to the impedance Zs of the impedance element 3 can be derived by integrating the output voltage Vout of the operational amplifier 1, it is also possible to create an impedance measuring apparatus utilizing the impedance-to-voltage converter of FIG. 2.

For the purpose of verifying the operation of the present invention, two examples of an impedance-to-voltage converter according to the present invention have been structured.

Figure 3:
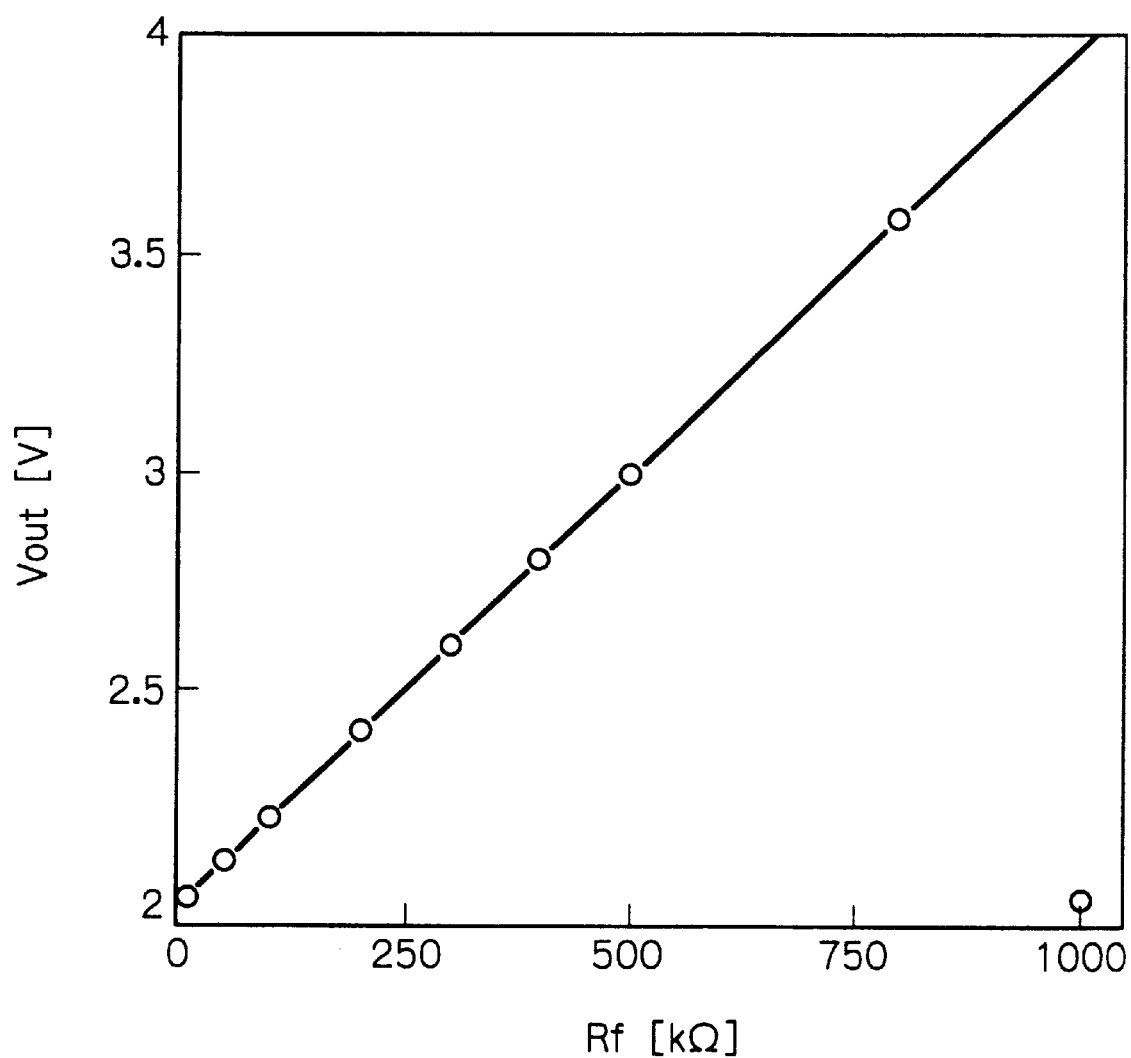
FIG. 3 shows an experimental result of an example of an impedance-to-voltage converter according to the present invention.

One of the examples of the impedance-to-voltage converter comprises the impedance element 3 which is a resistor having a variable resistance Rf (kΩ), the resistor 8 which has a resistance Ri equal to 1 MΩ, and the alternate current signal generator 6 which outputs a 1 kHz alternate current signal having the amplitude of 2 V with an offset voltage of 1 V. When the output voltage Vout are detected while changing the value of Rf, a graph shown in FIG. 3 is obtained. FIG. 3 clearly indicates that the output voltage Vout is in direct proportion to Rf/Ri.

Figure 4:
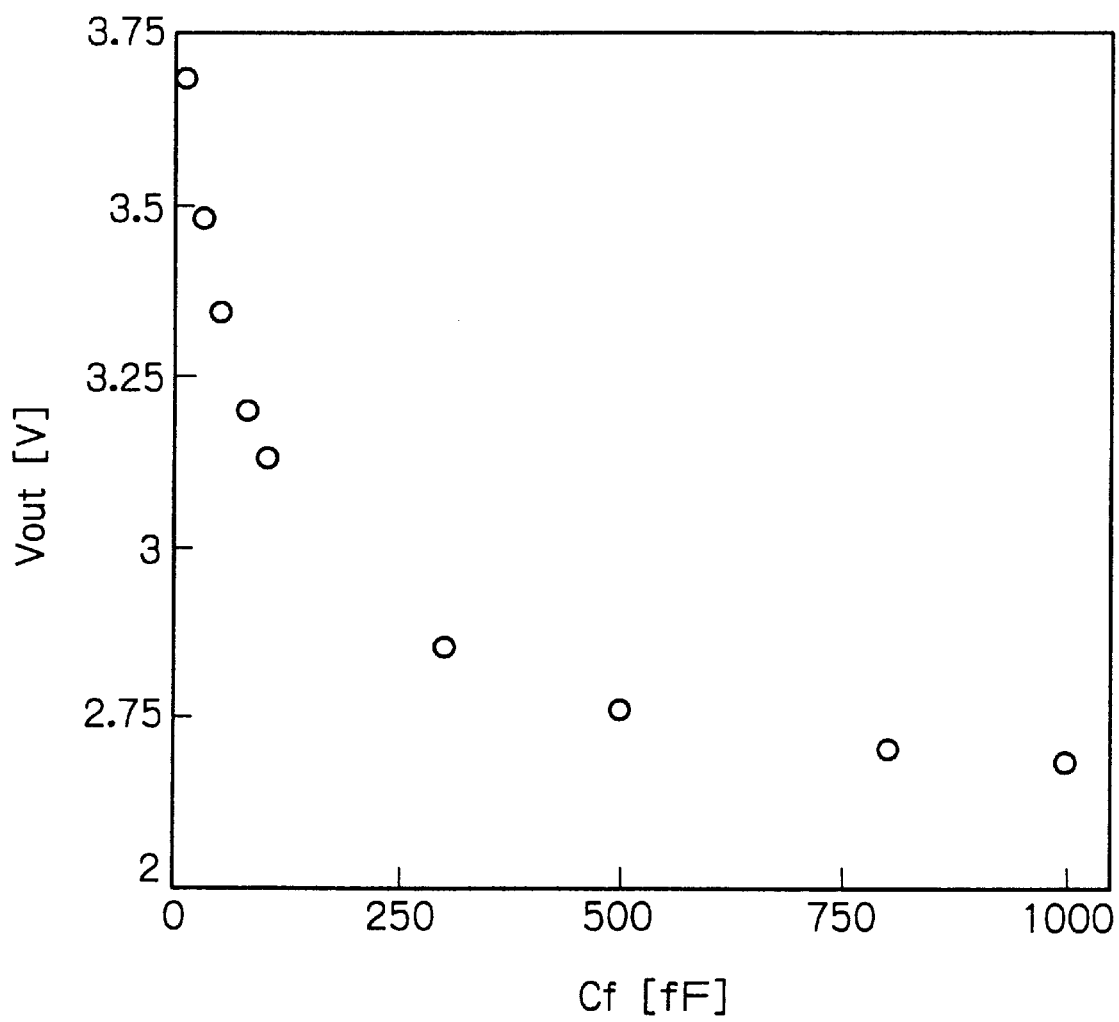
FIG. 4 shows an experimental result of another example of an impedance-to-voltage converter according to the present invention.

The other example of the impedance-to-voltage converter comprises the impedance element 3 which is a capacitor having a variable capacitance Cf (fF), and the alternate current signal generator 6 which outputs a 1 kHz alternate current signal having the amplitude of 0.1 V with an offset voltage of 2.5 V. In this example, it is noted that a capacitor having a capacitance Ci which is equal to 1 pF is used instead of the resistor 8 shown in FIG. 2. When the output voltage Vout are detected while changing the value of Cf, a graph shown in FIG. 4 is obtained. FIG. 4 indicates that the output voltage Vout is in direct proportion to Ci/Cf.

Industrial Applicability

As will be apparent from the foregoing description with reference to the embodiment, the present invention produces unique effects as follows:

(1) As a result of using an operational amplifier in an imaginary short-circuit state, stray capacitances produced between a connection line 1 a signal line and shielding lines will not appear between an inverting input and a non-inverting input of the operational amplifier. Therefore, for example, with a capacitive impedance element connected to the operational amplifier, even if its capacitance is very small, i.e., on the order of femtofarad (1/1000 of picofarad), the operational amplifier can output a voltage exactly corresponding to such a very small impedance of the impedance element under measurement, without suffering from stray capacitances as mentioned, thereby making it possible to make highly accurate conversion of the impedance into a voltage.

(2) A voltage corresponding to an impedance of an arbitrary impedance element can be highly accurately derived only in a simple circuit configuration.

(3) Since the impedance-to-voltage converter of the present invention need not use a feedback capacitor Cf which has been required in conventional static capacitance-to-voltage converters, it is possible to avoid a complicated process for producing the converter in a one-chip integrated form, and an increased size of the chip.

What is claimed is:

1. An impedance-to-voltage converter comprising:

an operational amplifier having an inverting input, a non-inverting input and an output, said operational amplifier placed in an imaginary short-circuit state between said inverting input and said non-inverting input;

an impedance element connected between said output and said inverting input containing a connection line having one end connected to said impedance element, and the other connected to said inverting input;

a circuit element having a known impedance;

a signal line having one end connected to said inverting in put, and the other connected to said circuit element;

a shield surrounding at least a portion of said signal line and/or said connection line, said shield being connected to said non-inverting input; and an AC voltage generator connected to said non-inverting input, wherein said operational amplifier outputs a signal which contains a value proportional to a signal applied from said AC voltage generator.

2. An impedance-to-voltage converter according to claim 1, wherein the impedance of said impedance element is at least one of resistance, inductance, capacitance, and conductance of a transistor.

3. An impedance-to-voltage converter according to claim 1, wherein said shield surrounds the whole of said signal line and said connection line.

4. An impedance-to-voltage converter according to claim 1, further comprising;

an inverting circuit for integrating an AC voltage at said output of the operational amplifier to produce a DC voltage.

5. An impedance-to-voltage converter according to claim 1, further comprising;

a device for biasing a known voltage to said circuit element.

6. A method of converting an impedance into a voltage corresponding to the change of an impedance of an impedance element, comprising the steps of:

providing an operational amplifier having an inverting input, a non-inverting input and an output;

connecting an impedance element between said inverting input and said output;

connecting a circuit element having a known impedance to said inverting input;

providing a shield for surrounding at least a portion of a connection line connected between said impedance element and said inverting input, and/or a signal line connected between said circuit element and said inverting input;

connecting said shield and said non-inverting input; and applying an AC voltage to said non-inverting input to produce at the output of the operational amplifier said voltage corresponding to the change of the impedance of said impedance element.

7. A method of converting an impedance into a voltage according to claim 6, wherein the impedance of said impedance element is at least one of resistance, inductance, capacitance, and conductance of a transistor.

8. A method of converting an impedance into a voltage according to claim 6, wherein;

said shield surrounds the whole of said signal line and said connection line.

9. A method of converting an impedance into a voltage according to claim 6, further comprising the step of;

integrating an AC voltage at said output of the operational amplifier to produce a DC voltage.

10. A method of converting an impedance into a voltage according to claim 6, further comprising the step of;

biasing a known voltage to said circuit element.

* * * * *

UNITED STATES PATENT AND TRADEMARK OFFICE
CERTIFICATE OF CORRECTION

PATENT NO. : 6,194,888 B1
DATED : February 27, 2001
INVENTOR(S) : Toshiyuki Matsumoto et al.

It is certified that error appears in the above-identified patent and that said Letters Patent is hereby corrected as shown below:

<u>Column 6,</u>
Lines 36-37, "in put," is corrected to read -- input, --.

Signed and Sealed this

Nineteenth Day of March, 2002

Attest:

Attesting Officer

JAMES E. ROGAN
Director of the United States Patent and Trademark Office